United States Patent
Reznicek et al.

(10) Patent No.: US 10,461,148 B1
(45) Date of Patent: Oct. 29, 2019

(54) MULTILAYER BURIED METAL-INSULTOR-METAL CAPACITOR STRUCTURES

(71) Applicant: International Business Machines Corporation, Armonk, NY (US)

(72) Inventors: Alexander Reznicek, Troy, NY (US); Joshua M Rubin, Albany, NY (US); Oscar Van Der Straten, Guilderland Center, NY (US); Praneet Adusumilli, Somerset, NJ (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/993,977

(22) Filed: May 31, 2018

(51) Int. Cl.
| | | |
|---|---|---|
| *H01L 49/02* | (2006.01) | |
| *H01L 29/66* | (2006.01) | |
| *H01L 23/522* | (2006.01) | |
| *H01L 27/108* | (2006.01) | |
| *H01L 27/11507* | (2017.01) | |
| *H01L 27/11502* | (2017.01) | |

(52) U.S. Cl.
CPC .......... *H01L 28/91* (2013.01); *H01L 23/5223* (2013.01); *H01L 28/92* (2013.01); *H01L 29/66181* (2013.01); *H01L 27/10861* (2013.01); *H01L 27/11502* (2013.01); *H01L 27/11507* (2013.01); *H01L 28/87* (2013.01); *H01L 28/88* (2013.01)

(58) Field of Classification Search
CPC ......... H01L 28/91; H01L 28/92; H01L 28/88; H01L 28/87; H01L 27/11502; H01L 27/11507
See application file for complete search history.

(56) References Cited

U.S. PATENT DOCUMENTS

| | | | | |
|---|---|---|---|---|
| 6,027,968 A | * | 2/2000 | Nguyen | H01L 28/87 438/254 |
| 6,346,455 B1 | * | 2/2002 | Thakur | H01L 28/87 257/E21.009 |
| 6,555,433 B2 | * | 4/2003 | Liaw | H01L 28/87 257/E21.016 |
| 6,737,699 B2 | * | 5/2004 | Block | H01L 27/0805 257/306 |
| 6,927,445 B2 | * | 8/2005 | Thakur | H01L 28/87 257/296 |

(Continued)

*Primary Examiner* — Nicholas J Tobergte
(74) *Attorney, Agent, or Firm* — Patterson + Sheridan, LLP (57) ABSTRACT

Metal-on-metal insulator structures and methods for making the same. The method includes: providing an insulator layer overlying a semiconductor substrate, forming a plurality of alternating first conductive layers and second conductive layers on the insulator layer, forming at least one dielectric layer between each of the alternating first conductive layers and second conductive layers, forming a first trench at a first location through a first portion of the plurality of the alternating first conductive layers and second conductive layers and the at least one dielectric layer, and first etching the first trench selective to the plurality of alternating first conductive layers and second conductive layers, wherein the first conductive layers are etched faster than the second conductive layers to form a first modified trench, wherein the first conductive layers are recessed relative to the center of the first modified trench greater than the second conductive layers.

20 Claims, 11 Drawing Sheets

(56) References Cited

U.S. PATENT DOCUMENTS

| | | | |
|---|---|---|---|
| 7,439,570 B2 | 10/2008 | Anthony | |
| 7,666,737 B2* | 2/2010 | Tu | H01L 27/10852 |
| | | | 257/E21.648 |
| 7,843,036 B2* | 11/2010 | Block | H01L 28/87 |
| | | | 257/306 |
| 7,868,383 B2* | 1/2011 | Argyres | H01L 23/585 |
| | | | 257/337 |
| 8,232,587 B2* | 7/2012 | Tu | H01L 28/86 |
| | | | 257/308 |
| 9,698,213 B1 | 7/2017 | Yang | |
| 9,871,052 B2* | 1/2018 | Lee | H01L 27/11582 |
| 9,876,068 B1 | 1/2018 | Yang | |
| 9,905,574 B2* | 2/2018 | Lee | H01L 27/11582 |
| 10,211,223 B2* | 2/2019 | Van Houdt | H01L 27/1159 |
| 2008/0149992 A1* | 6/2008 | Gidon | H01L 27/11521 |
| | | | 257/316 |
| 2008/0296731 A1* | 12/2008 | Block | H01L 27/0805 |
| | | | 257/532 |
| 2013/0081326 A1 | 4/2013 | Peterson | |
| 2017/0141182 A1 | 5/2017 | Adusumilli et al. | |
| 2017/0148811 A1* | 5/2017 | Zhang | H01L 27/11575 |
| 2018/0108651 A1 | 4/2018 | Kannan et al. | |

\* cited by examiner

MULTILAYER BURIED METAL-INSULTOR-METAL CAPACITOR STRUCTURES

BACKGROUND

1. Field of the Invention

The present invention generally relates to semiconductor integrated circuits, and more particularly, to the structure and formation of metal-insulator-metal capacitors in the semiconductor integrated circuits.

2. Related Art

High capacity capacitors have been used in the semiconductor industry for years, in applications such as eDRAM storage, protection from high energy environments, decoupling capacitors and many more. As integrated circuits continue to become more densely built, small and powerful decoupling capacitors are needed for optimal system performance. One such device is a metal-insulator-metal capacitor structure (MIM). There is a need for MIM capacitor structures in the manufacturing of eDRAM storage using bulk silicon substrates. In the past, MIM capacitors were fabricated on silicon-on-insulator substrates, but the latter has gone out of use in favor of bulk silicon substrates.

MIM capacitors can provide certain advantages over MOS and p-n junction capacitors because the frequency characteristics of MOS and p-n junction capacitors may be restricted as a result of depletion layers that form in the semiconductor electrodes. A MIM capacitor can therefore exhibit improved frequency and temperature characteristics. MIM capacitors are typically formed in successive metal interconnect layers of the back-end-of-the-line (BEOL) stage of the chip fabrication, the fabrication stage in which multiple metal interconnect layers interconnect the components and nodes, including components formed in the substrate during the front end of the line (FEOL) processing.

Conventional MIM capacitors may be comprised of a plurality of alternating layers of multiple metals separated by corresponding dielectric layer. Each of the metal layers is offset from another of the metal layers. Unfortunately, offsetting of each metal layer requires a separate masking layer, which results in a relatively high manufacturing cost. In addition, there is a limited horizontal area on a chip, which can lead to performance or scaling challenges.

SUMMARY

According to one embodiment of the present disclosure, a method for forming a semiconductor structure is provided. The method includes: metal-on-metal insulator structures and methods for making the same. The method includes providing an insulator layer overlying a semiconductor substrate. The method further includes forming a plurality of alternating first conductive layers and second conductive layers on the insulator layer. The method further includes forming at least one dielectric layer between each of the alternating first conductive layers and second conductive layers. The method further includes forming a first trench at a first location through a first portion of the plurality of the alternating first conductive layers and second conductive layers and the at least one dielectric layer, and first etching the first trench selective to the plurality of alternating first conductive layers and second conductive layers, wherein the first conductive layers are etched faster than the second conductive layers to form a first modified trench, wherein the first conductive layers are recessed relative to the center of the first modified trench greater than the second conductive layers, wherein each of the plurality of the recessed first conductive layers and the second recessed second conductive layers are in continuous contact with the at least one dielectric layer between each of the alternating recessed first conductive layers and the second recessed second conductive layers.

According to another embodiment of the present disclosure, another method for forming a semiconductor structure is provided. The method includes forming a plurality of alternating first conductive layers and second conductive layers. The method further includes forming at least one dielectric layer between each of the first conductive layers and second conductive layers. The method further includes forming a first trench through a first portion of the plurality of the alternating first conductive layers and second conductive layers, and the at least one dielectric layer. The method further includes first etching the first trench selective to the plurality of alternating first conductive layers and second conductive layers, wherein the first conductive layers are etched faster than the second conductive layers to form a first modified trench, wherein the first conductive layers are recessed relative to the center of the modified trench greater than the second conductive layers.

Another aspect of the present disclosure includes a semiconductor structure, where the structure includes a first semiconductor substrate in contact with a first insulator layer. A second semiconductor substrate is in contact with a second insulator, a plurality of alternating first conductive layers and second conductive layers formed on the first insulator layer overlying the first substrate, at least one dielectric layer between each of the alternating first conductive layers and the second conductive layers. A first conductive contact is formed in a first trench located in a first portion of the semiconductor structure in contact with the first conductive layers and isolated from the second conductive layers by a first isolation material in the first trench. A second conductive contact is formed in a second trench located in a second portion of the semiconductor structure in contact with the second conductive layers and isolated from the first conductive layers by a second isolation material in the second trench, wherein the first conductive layers are recessed relative to the center of the first trench greater than the second conductive layers. The second conductive layers are recessed relative to the center of the second trench greater than the first conductive layers. The plurality of alternating first conductive layers and the second conductive layers are formed underlying the second insulator layer and the second substrate.

DETAILED DESCRIPTION

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

At least one embodiment of the present disclosure provides for a metal-on-metal capacitive structure that can provide several advantages and address certain technical deficiencies in relation to the state of the art. According to one embodiment, a substrate with alternating distinct metal layers is provided, and a double selective etch is applied thereto which enables applying alternating metal contacts on each respective side of the structure, and can ultimately building high capacity stack therefrom. According to one embodiment, the alternating structure and application of the double etch can be accomplished without the use of a hardmask, which provides both a technical and economic advantages in terms of creating a structure with multiple metal layers, e.g. four or more layers of each alternating metal by eliminating process steps and material degradation, e.g. hard mask deposition and/or melting of metal layers. Moreover, one or more techniques described herein, including application of the double selective etch in conjunction with a bulk substrate with multiple alternating metal layers thereon, enable a more efficient adjustment and/or selection of the final capacitance associated with the structure because this scheme allows for a more flexible adjustment of area (which impacts the ultimate capacitance) in relevant portions for the structure. In one embodiment, the structure, e.g. buried structure, is more thermally stable by applying the above techniques, but also selecting less reactive metals for use with these techniques, which will further reduce the chance of the metals melting or reacting with the surrounding materials.

Figure 1:
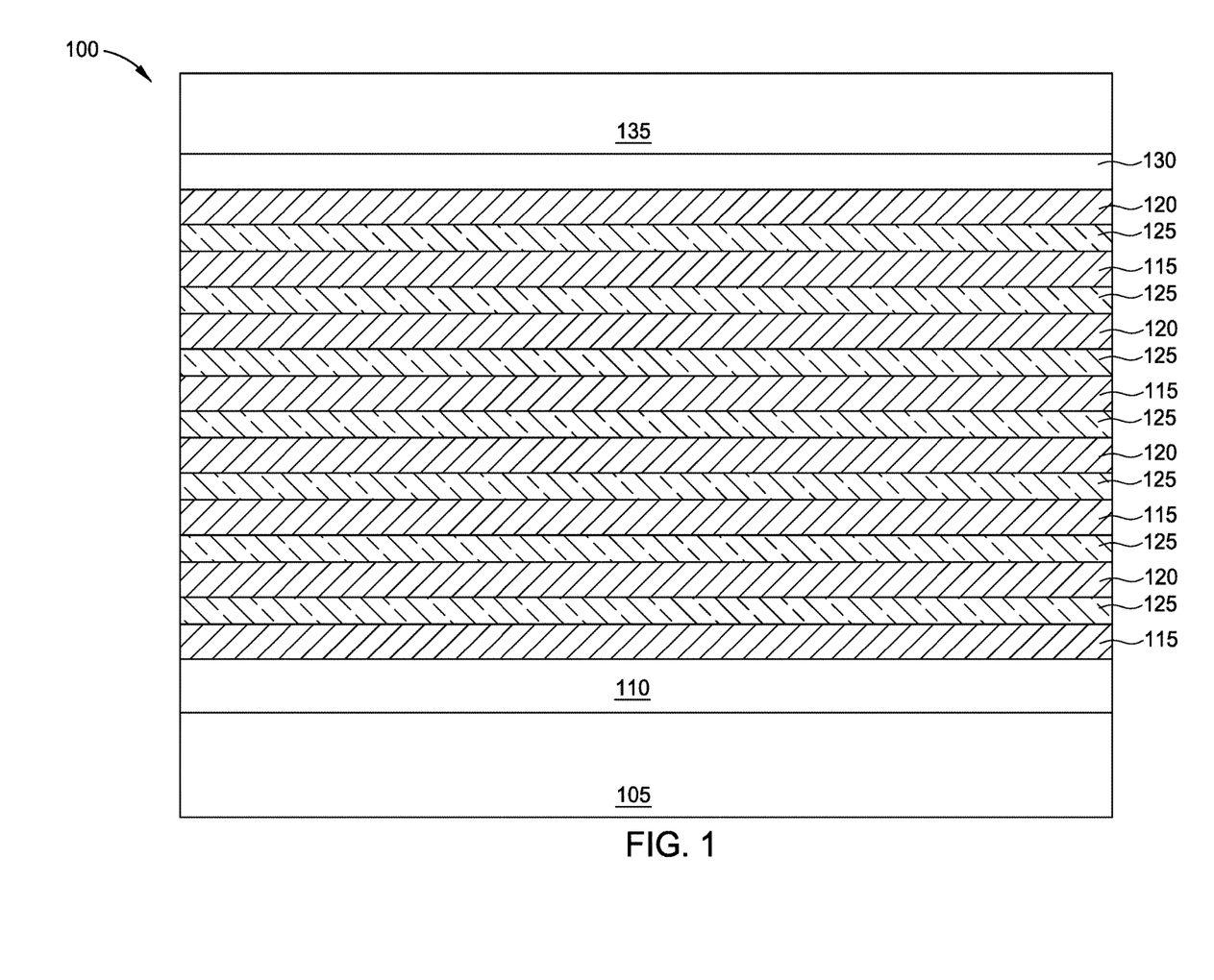
FIG. 1 is a cross-sectional view of an initial semiconductor structure.

FIG. 1 is a cross-sectional view of an initial semiconductor structure 100. The initial semiconductor structure includes a first semiconductor substrate 105, a first insulator layer 110 overlying the first semiconductor substrate 105, a metal-insulator-metal (MIM) material stack 107 overlying first insulator layer 110, a second insulator layer 130 overlying the MIM material stack 107, and a second semiconductor substrate 135 overlying the second insulator layer 130. The second semiconductor substrate 135 may have one or more layers (not shown) of semiconductor devices formed thereon.

Non-limiting examples of the materials comprising the first and second semiconductor substrates 105, 135, respectively, may include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. In one embodiment, the first semiconductor substrate 105 is a bulk Si based layer and the second semiconductor substrate 135 is a Si based layer. The second semiconductor substrate 135 and the second insulator layer 130 may be formed using a wafer bonding technique, such as SmartCut™. In the SmartCut™ method, the second insulator layer 130 overlying the MIM material stack 107 is bonded and annealed to a another insulator layer (not shown) of the same material type as the second insulator layer 130 formed on the second semiconductor substrate 135 originating from a second wafer different from the wafer comprising the first semiconductor substrate 105.

The insulator layers 110, 130 can be deposited using any suitable deposition technique, e.g. CVD. The insulator layers 110, 130 can be an oxide, nitride, or other suitable material, where in one embodiment, both insulator layers 110, 130 are silicon dioxide layers.

The initial semiconductor structure 100 further includes alternating metal layers 115 (hereinafter "metal 1" and 120 (hereinafter "metal 2"), where in one embodiment the metal 1 layers 115 are of a different material from the metal 2 layers 120. The metal layers 115, 120 can be copper (Cu), tungsten (W), aluminum (Al), silver (Ag), gold (Au), titanium nitride (TiN), and alloys thereof, where in one embodiment, as stated, metal layer(s) 1 115 is of a different type than metal 2 layer(s) 120. In one embodiment, metal 1 layer(s) 115 is a W based layer and metal layer(s) 120 is a TiN layer, or visa-versa. The metal layers 115, 120 can also comprise highly-doped polycrystalline semiconductor materials such as Silicon.

One or more metal 1 layers 115 can be, but are not necessarily, the same material, and similarly one or more metal 2 layers 120 can be but are not necessarily, the same material. In one embodiment, as discussed below, all of the metal 1 layers 115 are selected so that a first etch process can be applied such that the metal 1 layers 115 can be etched selectively relative faster than the metal 2 layers 120, and a second etch process can be applied such that the metal 2 layers 120 can be selectively etched more rapidly than the metal 1 layers 115.

The metal layers 115, 120 are separated by one or more dielectric layers 125. The one or more dielectric layers 125 separating the alternating metal layers 115, 120 can be formed by conventional deposition such as CVD, PECVD or ALD. In an embodiment, the one or more dielectric layers 125 is a high-K dielectric made from a material having a dielectric constant greater than 2.5, and can have dielectric constant in the range of 15 to 20, or even greater than 20. Suitable high-K dielectric materials include an oxide, e.g. hafnium oxide (HfO2), zirconium oxide, or aluminum oxide. Other suitable materials including but not limited to hafnium silicate or zirconium silicate can also be used. The dielectric layers 125 can also be any other dielectric compound, and can be a combination of dielectric materials. The one or more dielectric layers 125 can separate the metal layers 115, 120 from one another.

The thickness of the metal layers 115, 120 is determined by structural integrity of the metal and the conductivity requirement as well as the number of layers desired and the dimension of the cavity. Typical thickness ranges between 50 angstroms and 500 angstroms with 100 A to 200 A being the preferred thickness. The initial structure 100, when modified in accordance with the techniques discussed herein, provides an advantage over conventional techniques by offering a denser structure with a greater number of layers, e.g. four or more metal layers for each alternating metal kind, and offering such a structure without use of a hard mask and without compromising material and functional integrity that is associated with high temperature processes.

Figure 2:
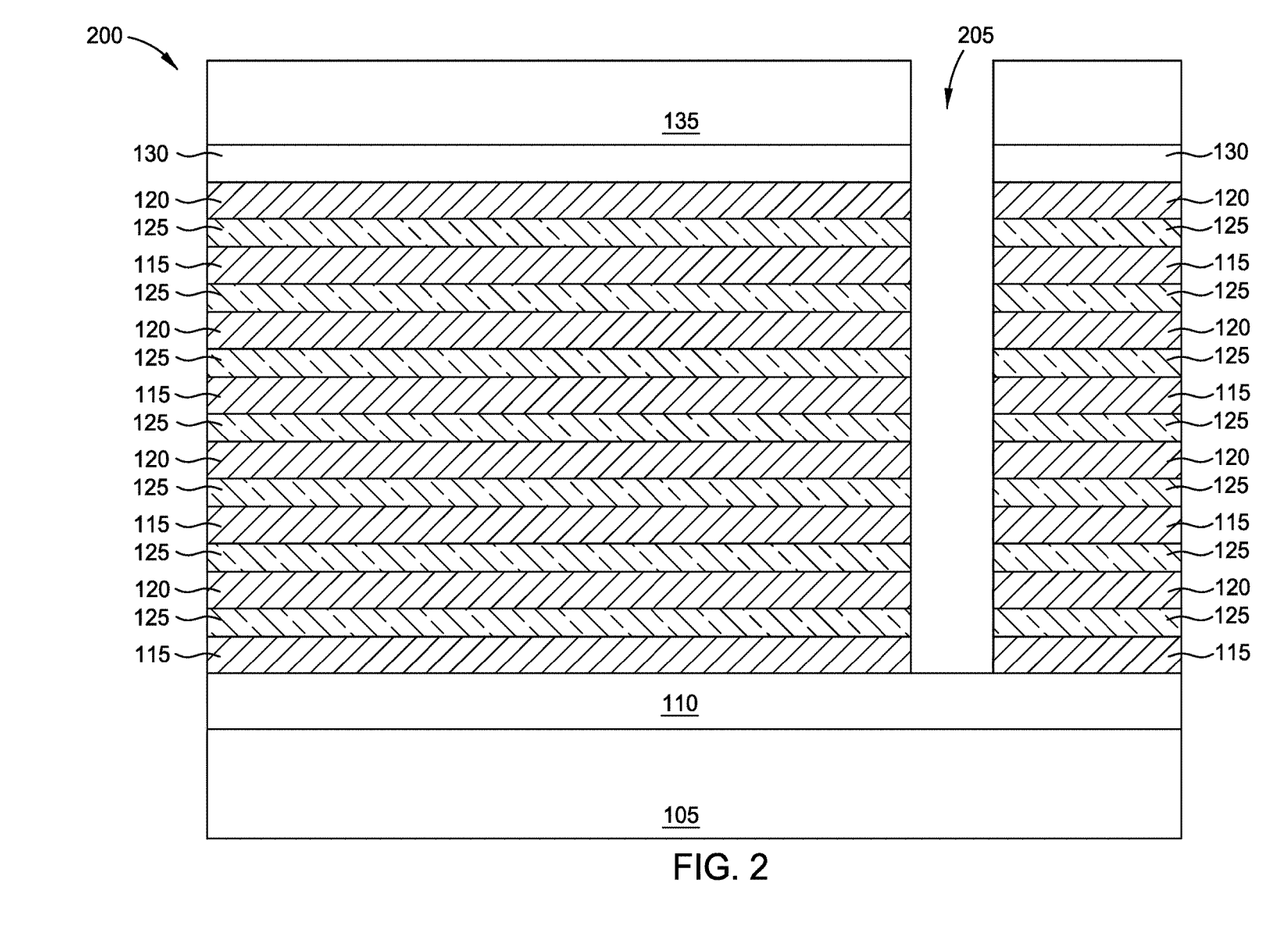
FIG. 2 is a cross-sectional side view of a semiconductor structure corresponding to the semiconductor structure of FIG. 1 after forming a first trench through the second semiconductor substrate, the second insulator layer, and the MIM material stack, selective to the first insulator layer.

FIG. 2 is a cross-sectional side view of a semiconductor structure 200 corresponding to the initial semiconductor structure 100 of FIG. 1 after formation of a first trench 205 through the second semiconductor substrate 135, the second insulator layer 130, and the MIM material stack 107 selective to the first insulator layer 110. The first trench 205 may be formed using a first etch process, which may be, but is not limited to, e.g. reactive-ion etching (RIE). Forming the first trench 205 facilitates a second etch process as described in FIG. 3. The second etch creates two stacks of the same materials, which includes device silicon layers 135, second insulator layer 130, alternating metal layer(s) 115, 120, and dielectric layer(s) 125.

Figure 3:
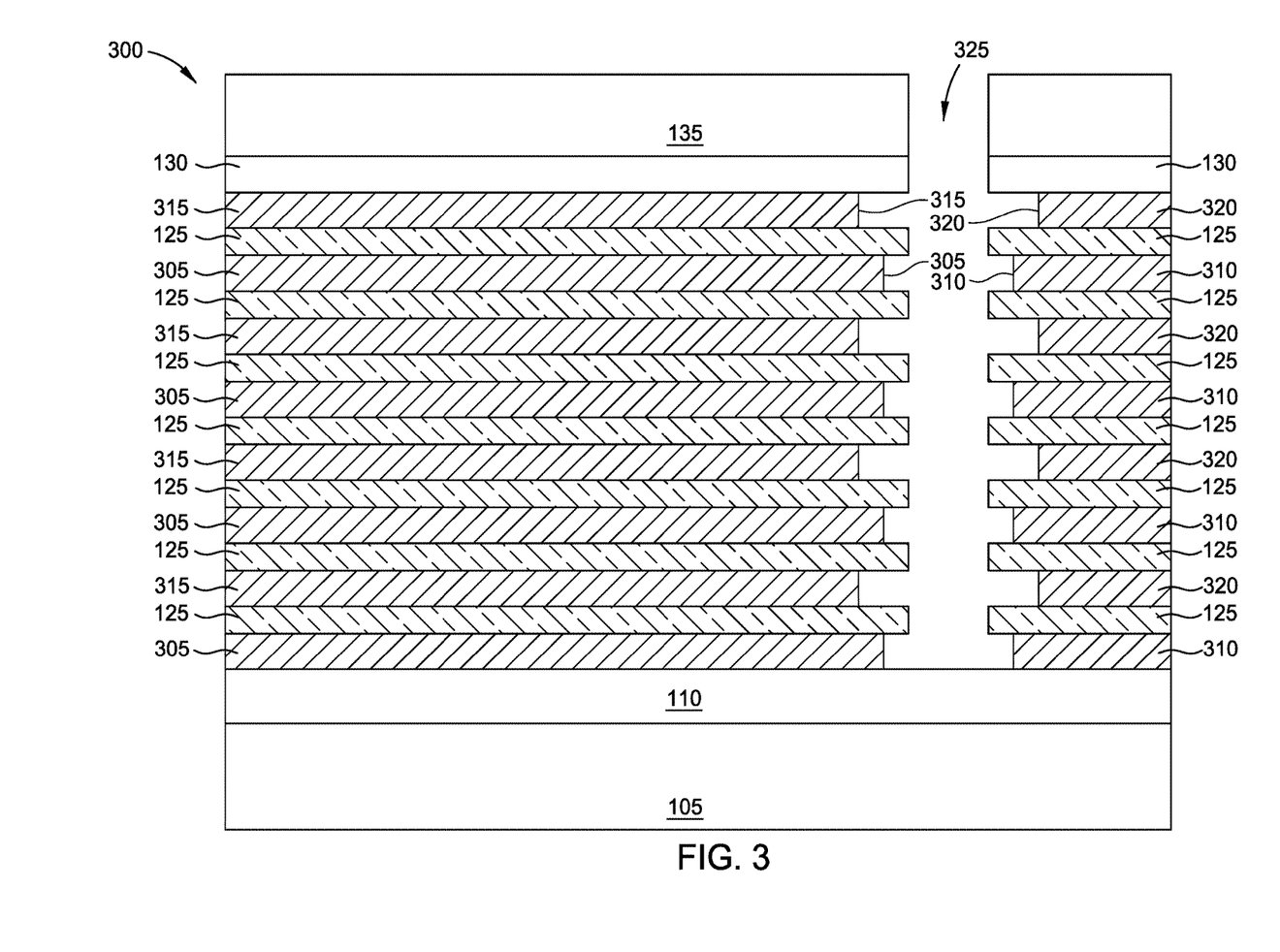
FIG. 3 is a cross-sectional side view of a semiconductor structure corresponding to the semiconductor structure of FIG. 2 after performing a second etch process of both sets of metal layers selective to each other.

FIG. 3 is a cross-sectional side view of a semiconductor structure 300 corresponding to the semiconductor structure 200 of FIG. 2 after performing a second etch process of both sets of metal layers 115, 120 selective to each other, wherein metal 2 layers 120 are etched with a first etching material faster than etching the metal 1 layers 115 with a second etching material. The second etch process is selective to metal layers 115, 120 and excludes the dielectric layers 125. The resulting recessed metal 2 layers 315, 320 are etched deeper than resulting metal 1 layers 305, 310. The resulting structure 300 includes recessed metal 1 layer(s) 305, 310 and more recessed metal layers 315, 320 relative to the center of the first trench 205, with un-recessed dielectric layers 125 therebetween, resulting in a modified trench 325. In one embodiment, the metal 1 layer(s) 115, are TiN based layers, and the metal 2 layer(s) 120 are W layers. In one embodiment, the second etch process is a dry nitrogen-trifluoride ($NF_3$) plasma etch process performed at approximately 85 degrees C., resulting in approximately a 2.5:1 (W:TiN) etch rate.

Figure 4:
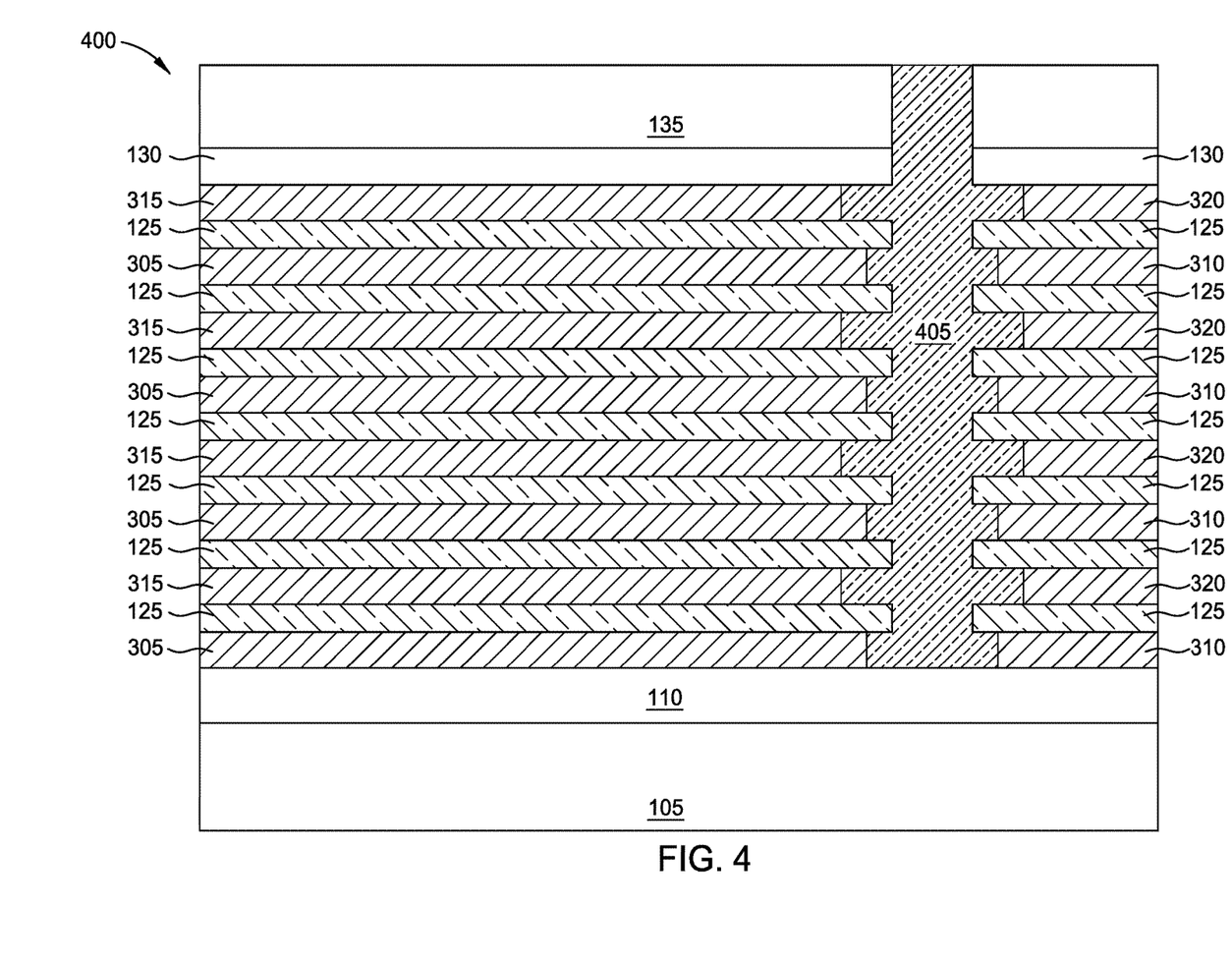
FIG. 4 is a cross-sectional side view of a semiconductor structure corresponding to the semiconductor structure of FIG. 3 after depositing an isolating layer in the modified trench.

FIG. 4 is a cross-sectional side view of a semiconductor structure 400 corresponding to the semiconductor structure 300 of FIG. 3 after depositing an isolating layer 405 in the modified trench 325. The isolating layer 405, e.g. an oxide material, is deposited in modified trench 325 to isolates the metal layer(s) 305, 315 from metal layer(s) 310, 320, respectively. The deposition, according to one embodiment, is also such that, in conjunction with the offset between the metal layers 305, 315 from the metal layers 310, 320.

Figure 5:
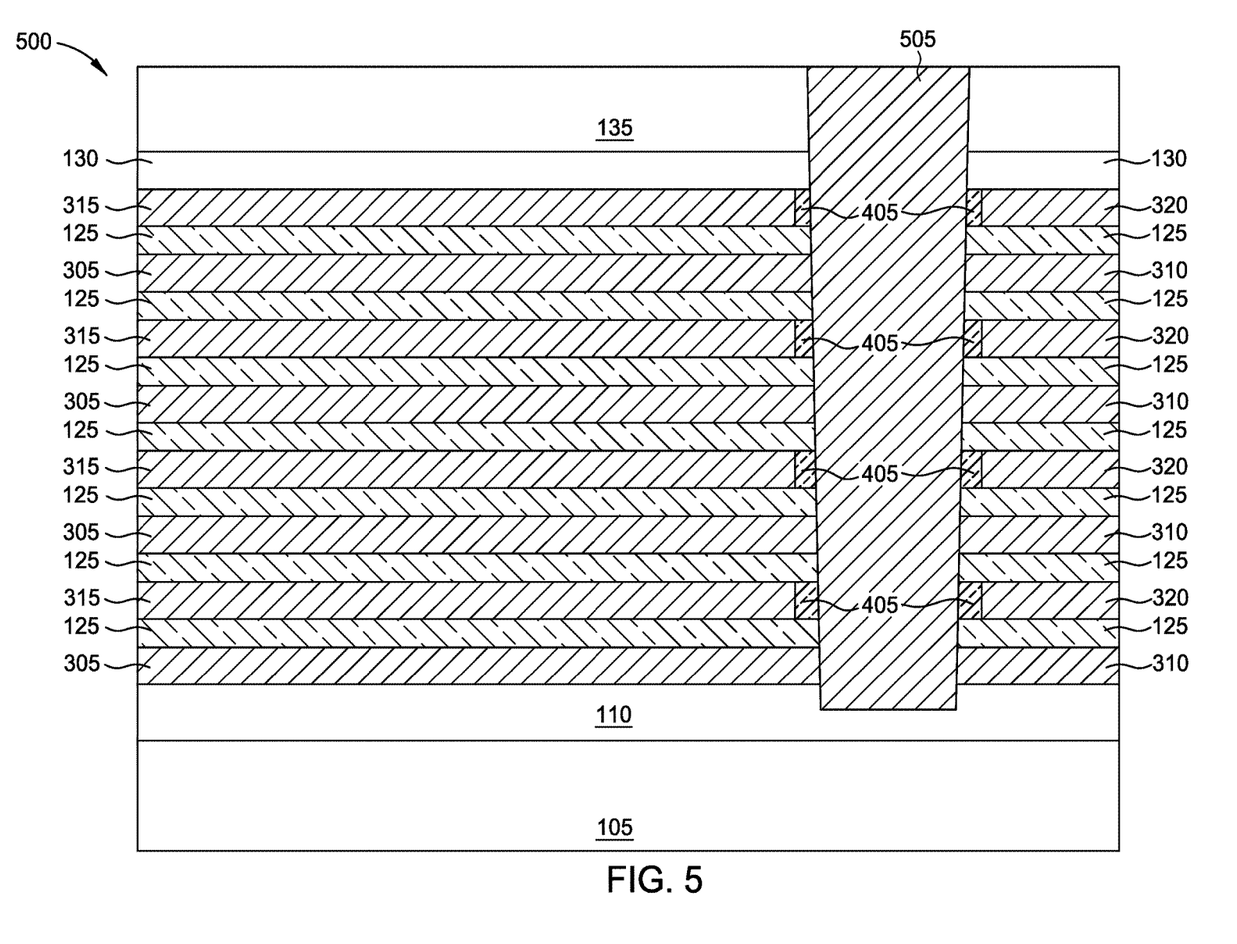
FIG. 5 is a cross-sectional side view of a semiconductor structure corresponding to the semiconductor structure of FIG. 4 after forming a first contact in the modified trench.

FIG. 5 is a cross-sectional side view of a semiconductor structure 500 corresponding to the semiconductor structure 400 of FIG. 4 after forming a first contact 505 in the modified trench 325. The first contact 505 is deposited through the structure 500 including the isolation layer 405 in the modified trench 325 and is buried at least partially in the first insulator layer 110. In one embodiment, the residual portions of the isolating layer 405 isolates the recessed metal 2 layers 315, 320 from the first contact 505. In other words, the first contact 505 does not directly contact the recessed metal 2 layers 315, 320. The first contact 505 does, however, contact each of the recessed metal 1 layers 305, 310. In one embodiment, the first contact 505 matches the type of metal as that of recessed metal 1 layers 305, 310, where in one embodiment, the first contact 505, the metal 1 layer 305, and the metal layer 310 are TiN layers. In another embodiment, the first contact 505 may be copper supplemented along sidewalls of the modified trench 325 with a liner layer (not shown) to prevent diffusion when one or both of the metal layers 305, 310 are made of a poly-crystalline semiconductor material.

Figure 6:
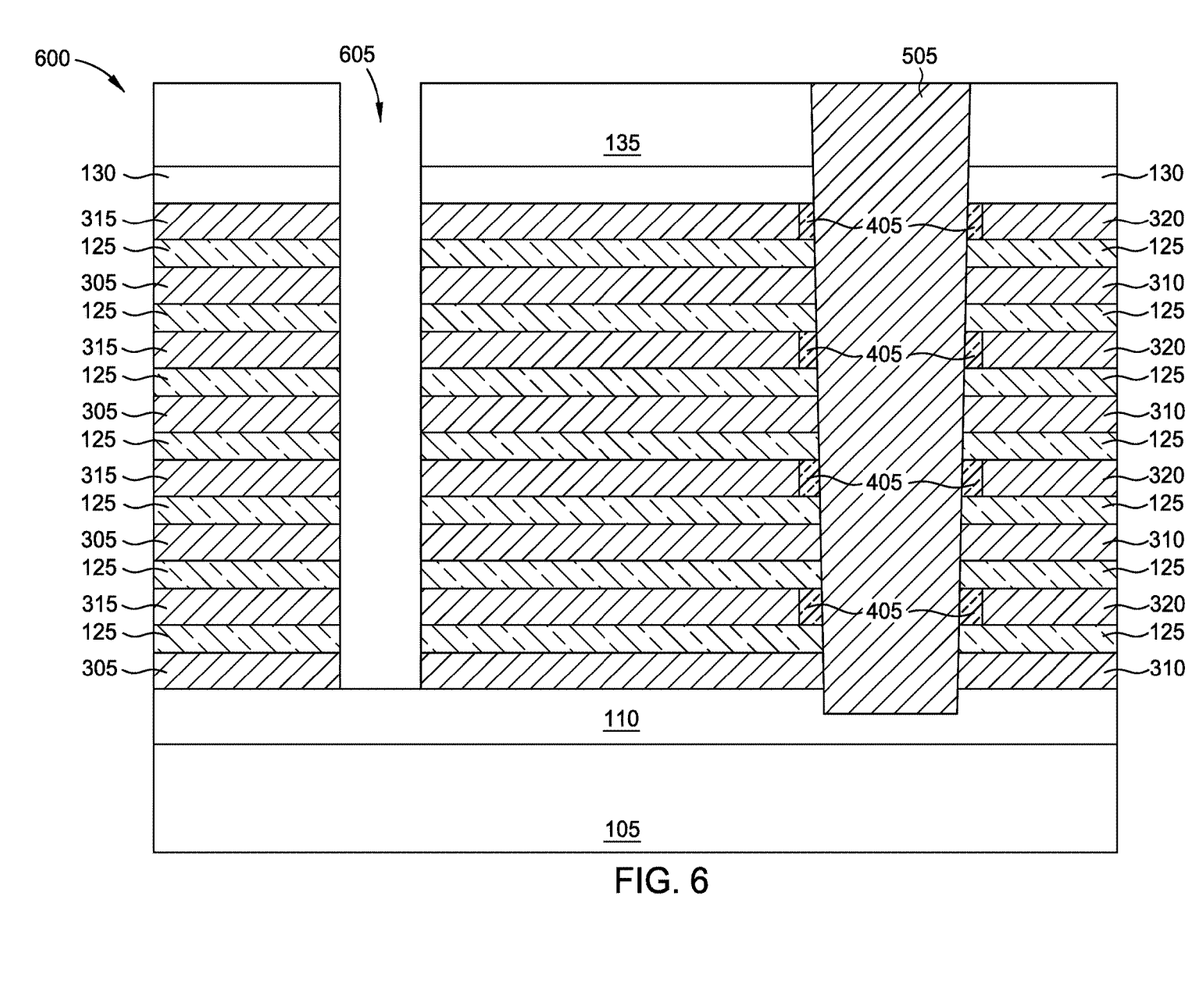
FIG. 6 is a cross-sectional side view of a semiconductor structure corresponding to the semiconductor structure of FIG. 5 after forming a second trench.

FIG. 6 is a cross-sectional side view of a semiconductor structure 600 corresponding to the semiconductor structure 500 of FIG. 5 after formation of a second trench 605 through the second semiconductor substrate 135, the second insulator layer 130, and the MIM material stack 107 selective to the first insulator layer 110 in a second location of the semiconductor structure 500 distal to the first modified trench 325. The second trench 605 may be formed using an etch process, which may be, but is not limited to, e.g. reactive-ion etching (RIE). Forming the second trench 605 facilitates a fourth etch process as described in FIG. 7. The etch creates three stacks of the same materials, which includes the second semiconductor substrate layers 135, the second insulator layers 130, alternating metal layer(s) 115, 120, and the dielectric layer(s) 125. The second trench 605 facilitates a fourth etch process as described in FIG. 7.

Figure 7:
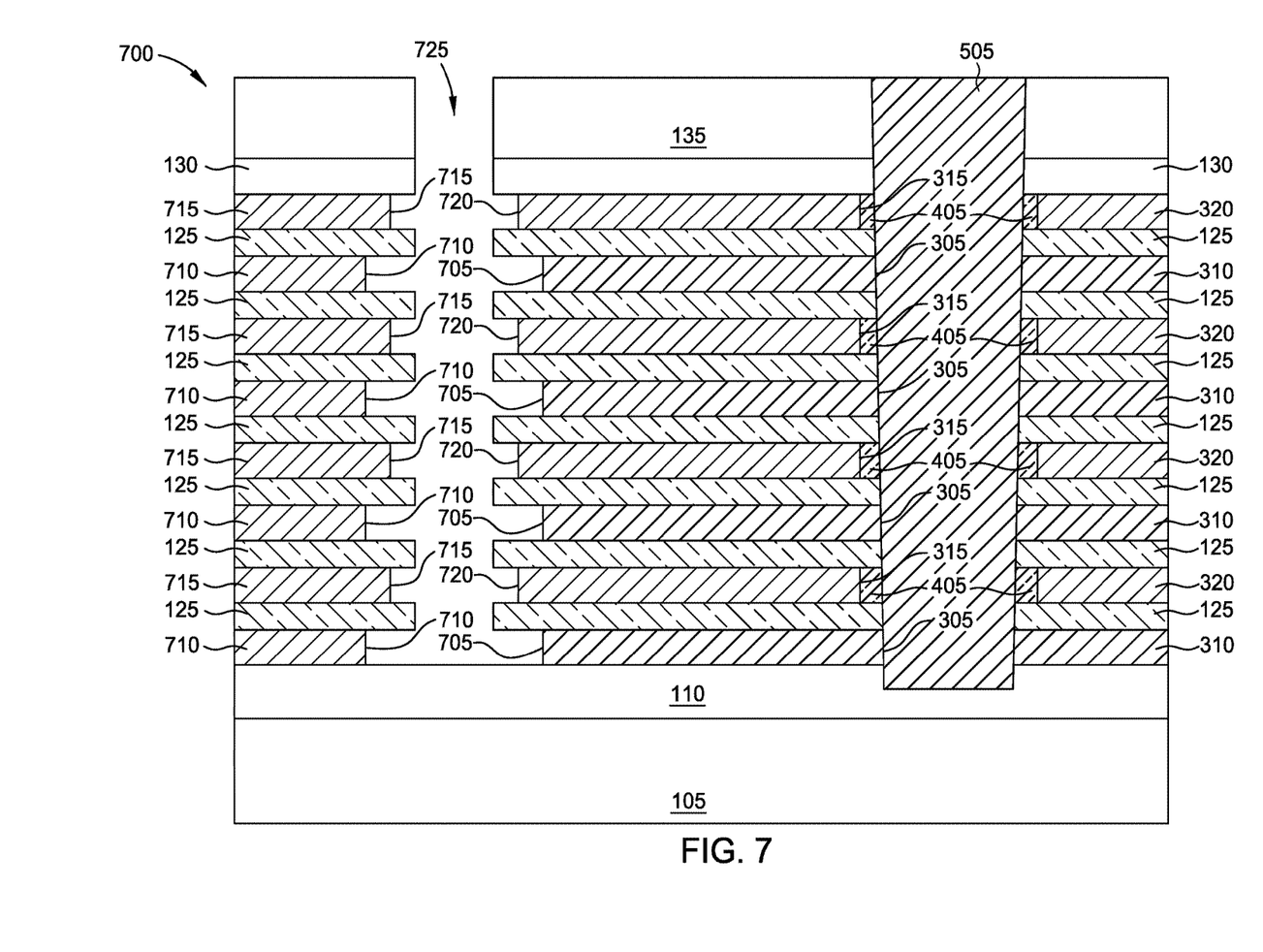
FIG. 7 is a cross-sectional side view of a semiconductor structure corresponding to the semiconductor structure of FIG. 6 after performing a third etch process similar to the first etch process of both metal layers selective to each other.

FIG. 7 is a cross-sectional side view of a semiconductor structure 700 corresponding to the semiconductor structure 600 of FIG. 6 after performing a third etch process similar to the first etch process of both metal layers selective to each other, wherein the metal 1 layers 705, 710 are etched with the second etching material faster than etching the metal 2 layers 715, 720 with the first etching material. The third etch process is selective to metal layers 705-720 and excludes un-recessed dielectric layers 125. In one embodiment, the third etch process is more selective with respect to the metal layers 1 705, 710 in relation to the metal 2 layers 715, 720, e.g., the metal 1 layers 705, 710 are etched at a faster rate than metal 2 layers 715, 720, and this enables an offset between the metal layers of a different metal type, e.g. resulting metal 1 layers 705, 710 are etched deeper (in the horizontal direction) than resulting metal 2 layers 715, 720 relative to the center of the second trench 605. The resulting structure 700 includes recessed metal 2 layer(s) 715, 720 and more recessed metal 1 layers 705, 710, resulting in the formation of a second modified trench 725. In one embodiment, the metal layer(s) 705, 710 are W based layers, and the metal 2 layers 715, 720 are TiN layers. In one embodiment, a dry nitrogen-trifluoride ($NF_3$) plasma etch process performed at approximately 250 degrees C., resulting in approximately a 0.4:1 (W:TiN) etch rate.

Figure 8:
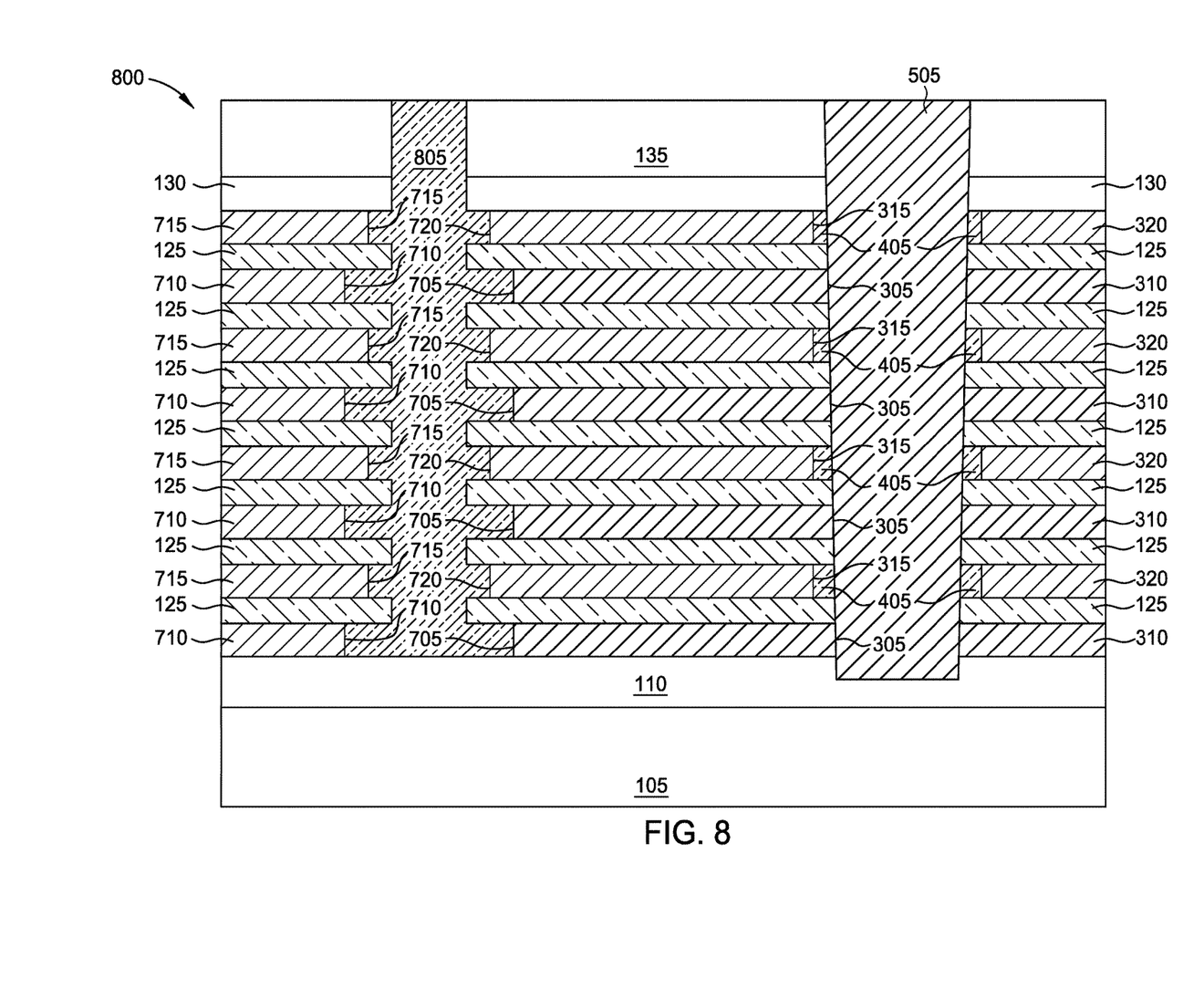
FIG. 8 is a cross-sectional side view of a semiconductor structure corresponding to the semiconductor structure of FIG. 7 after depositing a second isolating layer in the second modified trench.

FIG. 8 is a cross-sectional side view of a semiconductor structure 800 corresponding to the semiconductor structure 700 of FIG. 7 after depositing a second isolating layer 805 in the second modified trench 725. The second isolating layer 805, e.g., an oxide material, is deposited in the second modified trench 725 to isolates metal layer(s) 705, 720 from metal layer(s) 710, 715 respectively. The deposition, according to one embodiment, is also such that, in conjunction with the offset between the metal 1 layers 705, 710 and the metal 2 layers 715, 720, a subsequent metal contact, as discussed in FIG. 9, can connect the metal 2 layers 715, 720 to the deposited contact, while keeping the metal 1 layers 705, 710 electrically isolated from the deposited contact.

Figure 9:
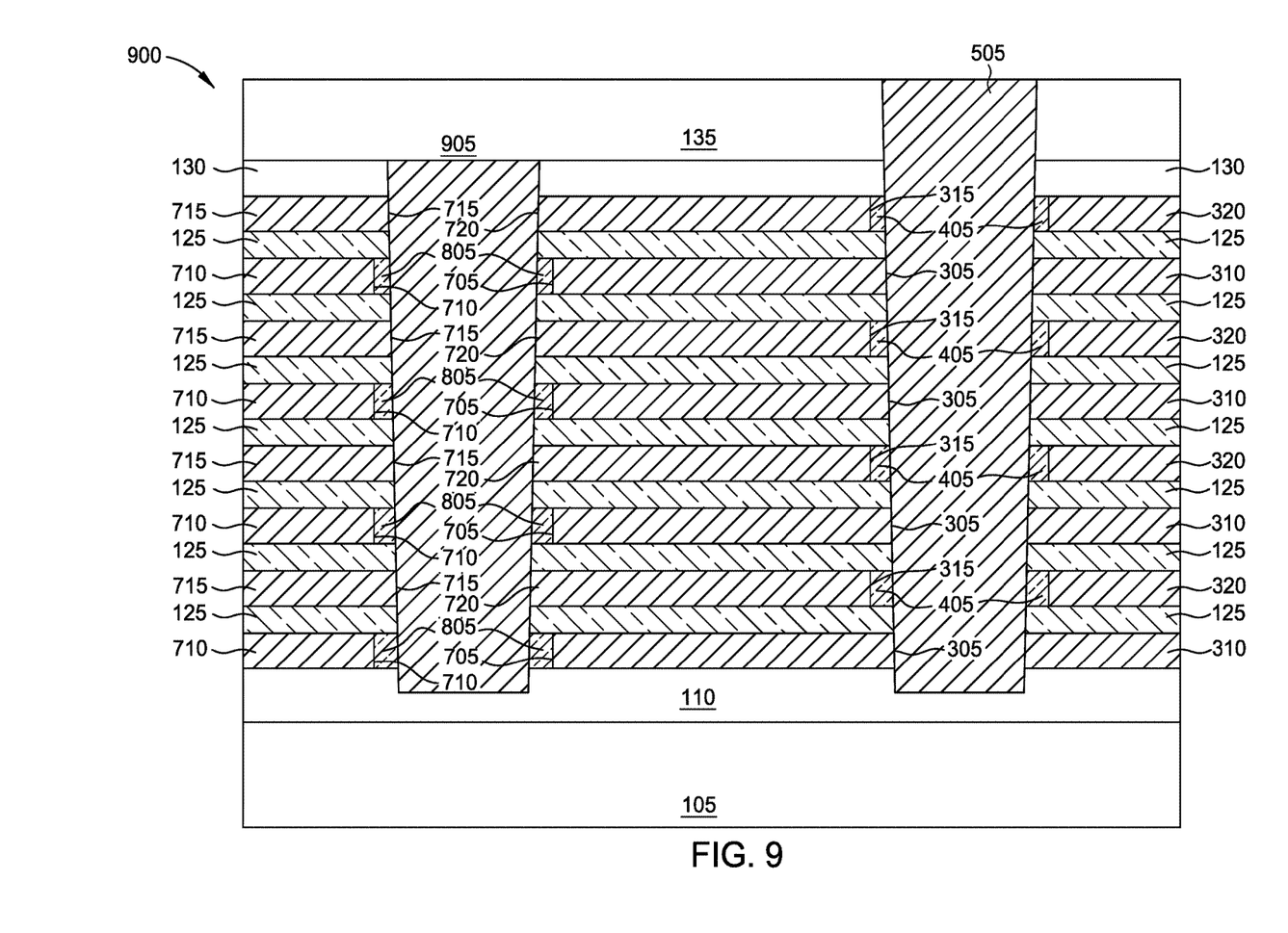
FIG. 9 is a cross-sectional side view of a semiconductor structure corresponding to the semiconductor structure of FIG. 8 after forming a second contact in the second modified trench.

FIG. 9 is a cross-sectional side view of a semiconductor structure 900 corresponding to the semiconductor structure 800 of FIG. 8 after forming a second contact 905 in the second modified trench 725. The second contact 905 is deposited through the structure 800 500 including the isolation layer 805 in the second modified trench 725 and is buried at least partially in the first insulator layer 110. In one embodiment, the residual portions of the isolating layer 805 isolates the recessed metal 1 layers 705, 710 from the second contact 905 such that the second contact 905 does not directly contact the recessed metal 1 layers 705, 710. The second contact 905 contacts each of the recessed metal 2 layers 715, 720. In one embodiment, the second contact 905 matches the type of metal as that of recessed metal 2 layers 715, 720, where in one embodiment, the second contact 905, the metal 2 layer 715, and the metal 2 layer 720 are W layers. In another embodiment, the second contact 905 may be copper supplemented along sidewalls of the second modified trench 725 with a liner layer (not shown) to prevent diffusion when one or both of the metal 2 layers 715, 720 are made of a poly-crystalline semiconductor material.

Figure 10:
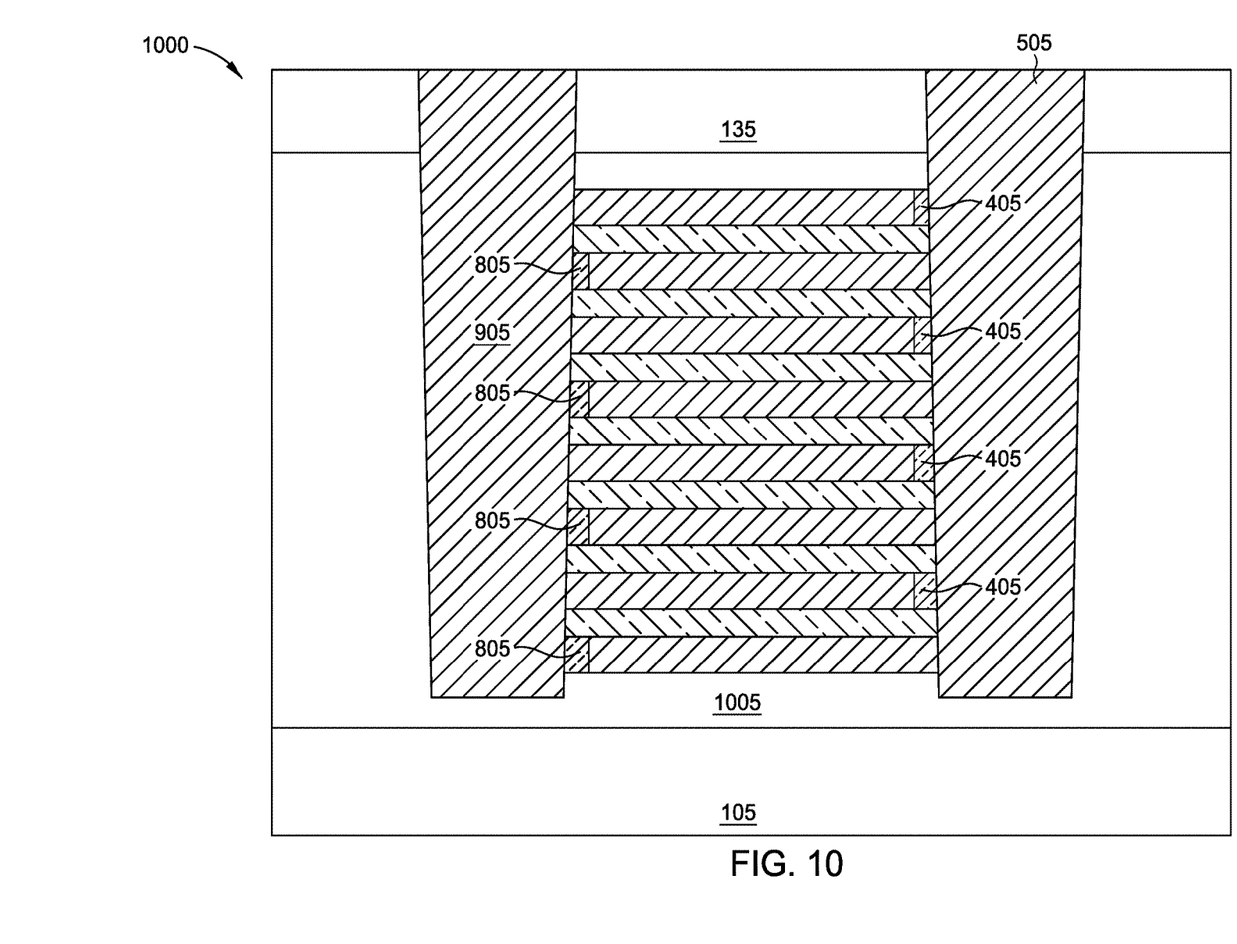
FIG. 10 is a cross-sectional side view of a final semiconductor structure corresponding to the semiconductor structure of FIG. 9 after removing the stacks that include outer portions of the metal 1 layers and the metal 2 layers.

FIG. 10 is a cross-sectional side view of a semiconductor structure 1000 corresponding to the semiconductor structure 900 of FIG. 9 after removing the stacks that include outer portions of the metal 1 layers 705, 710 and the metal 2 layers 715, 720 using any suitable recess or removal process, and depositing a dielectric or insulator material, e.g., in a resulting openings 1005 and connecting with the existing first insulator layer 110, e.g. an oxide. Any suitable inter-layer dielectric formation process can be applied to form an interconnect and form structure 1000, thus forming a completed metal-on-metal insulator capacitor structure, e.g. structure 1000.

Figure 11:
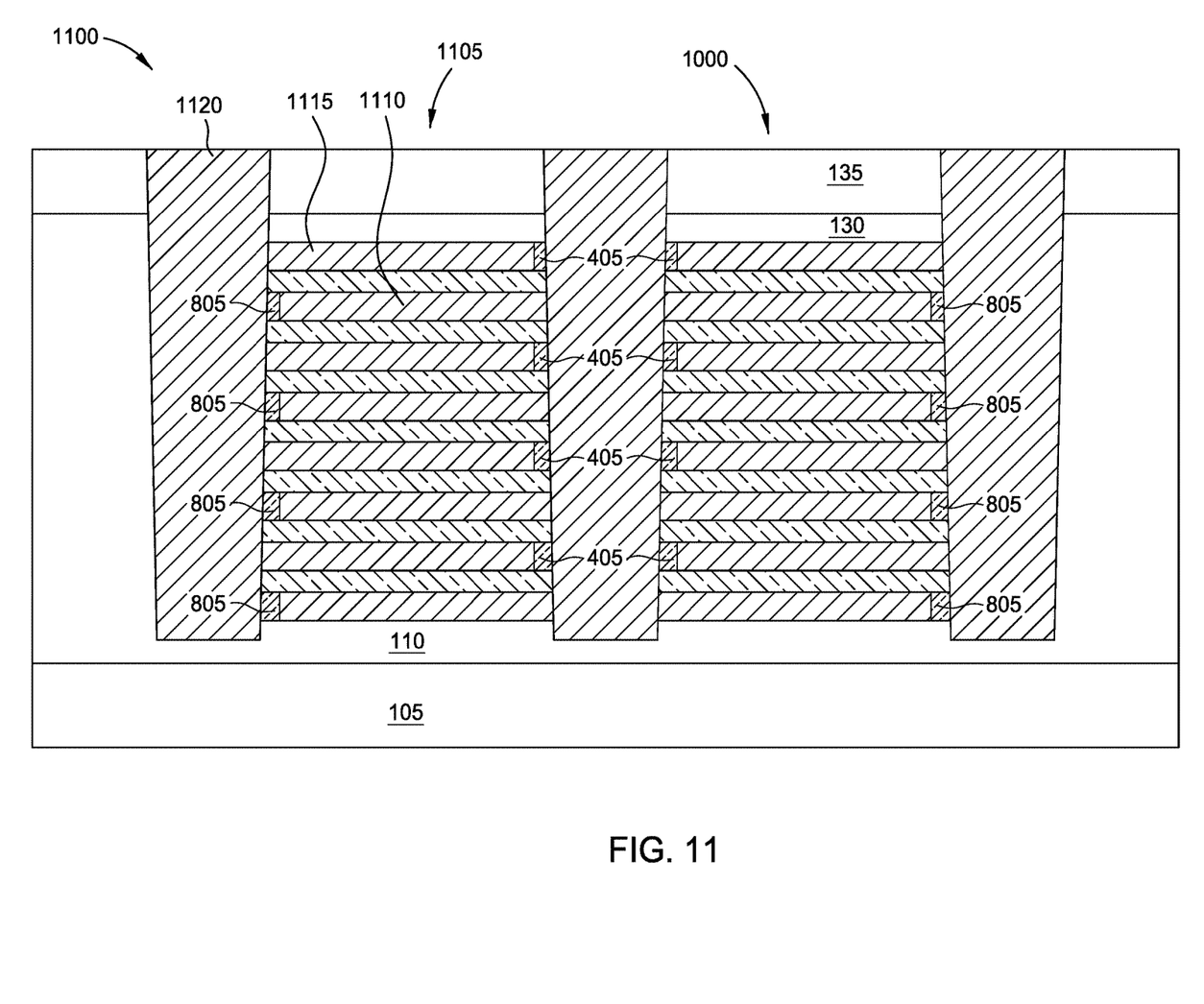
FIG. 11 is a cross-sectional side view of a semiconductor structure which extends the two-contact MIM capacitor stack of FIG. 10 to two or more combined multiple-contact MIM capacitor stacks.

FIG. 11 is a cross-sectional side view of a semiconductor structure 1100 which extends the two-contact MIM capacitor stack 1000 to two or more combined multiple-contact MIM capacitor stacks 1100. The two-contact MIM capacitor stack 1000 can be extended to a third contact second MIM capacitor stack 1105 wherein the metal 1 layers 1110 are recessed more than the metal 2 layers 1115. The metal 1 layers 1110 are isolated from a second metal 2 contact 1120 while the metal 2 layers 1115. The resulting structure produces a MIM capacitor 1100 with double the capacitance of the MIM capacitor stack 1000, since the resulting two capacitors are connected in parallel.

According to one embodiment, given the nature of initial semiconductor structure 100 and the subsequent deposition and etch techniques, a hard mask can be completely omitted in performing one or more, e.g. all, of the above techniques and/or steps.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system."

While the foregoing is directed to embodiments of the present invention, other and further embodiments of the invention may be devised without departing from the basic scope thereof, and the scope thereof is determined by the claims that follow.

What is claimed is:
1. A method comprising:
  providing an insulator layer overlying a semiconductor substrate;
  forming a plurality of alternating first conductive layers and second conductive layers on the insulator layer;

forming at least one dielectric layer between each of the alternating first conductive layers and second conductive layers;

forming a first trench at a first location through a first portion of the plurality of the alternating first conductive layers and second conductive layers and the at least one dielectric layer; and etching the first trench selective to the plurality of alternating first conductive layers and second conductive layers, wherein the first conductive layers are etched faster than the second conductive layers to form a first modified trench, wherein the first conductive layers are recessed relative to the center of the first trench greater than the second conductive layers, wherein each of the plurality of the recessed first conductive layers and the second recessed second conductive layers are in continuous contact with the at least one dielectric layer between each of the alternating recessed first conductive layers and the second recessed second conductive layers.

2. The method of claim 1, further comprising:
forming a second trench at a second location through a second portion of all of the plurality of the of alternating first conductive layers and second conductive layers and the at least one dielectric layer; and
etching the second trench selective to the plurality of the alternating first conductive layers and second conductive layers, wherein the second conductive layers are etched faster than the first conductive layers to form a second modified trench, and wherein the second conductive layers are recessed relative to the center of the second trench greater than the first conductive layers.

3. The method of claim 1, wherein the first conductive layers are metal layers of a first metallic material, and the second conductive layers are metal layers of a second metallic material different from the first metallic material.

4. The method of claim 1, wherein the first conductive layers are polycrystalline doped semiconductor material layers of a first material, and the second conductive layers are doped polycrystalline semiconductor material layers of a second material different from the first material.

5. The method of claim 1, wherein the first and the second trenches are nitrogen-trifluoride (NF$_3$) etch processes.

6. The method of claim 5, wherein etching the first trench is carried out at a temperature of approximately at 250° C.

7. The method of claim 5, wherein the etching the second trench is carried out at a temperature of approximately at 85° C.

8. The method of claim 2, further comprising:
after etching the first trench, depositing a first isolating material in the first modified trench; and
after etching the second trench, depositing a second isolating material in the second modified trench.

9. The method of claim 8, further comprising:
depositing a first conductive contact through the first isolating material such that the recessed first conductive layers contacts the conductive first contact and the recessed second conductive layers contact the second isolating material without contacting the recessed first conductive layers.

10. The method of claim 9, further comprising:
depositing a second conductive contact through the second isolating material such that the recessed second conductive layers contacts the conductive second contact and the recessed first conductive layers contact the second isolating material without contacting the recessed second conductive layers.

11. The method of claim 10, further comprising:
removing portions of the first conductive layers, the second conductive layers, and the at least one dielectric layer between each of the alternating first conductive layers and the second conductive layers external to the first contact and the second contact; and
forming an insulator region about the periphery of the first contact and the second contact.

12. A method for forming a semiconductor device comprising:
forming a plurality of alternating first conductive layers and second conductive layers;
forming at least one dielectric layer between each of the first conductive layers and second conductive layers;
forming a first trench through a first portion of the plurality of the alternating first conductive layers and second conductive layers and the at least one dielectric layer; and
etching the first trench selective to the plurality of alternating first conductive layers and second conductive layers, wherein the first conductive layers are etched faster than the second conductive layers to form a first modified trench, wherein the first conductive layers are recessed relative to the center of the first trench greater than the second conductive layers.

13. The method of claim 12, further comprising:
forming a second trench at a second location through a second portion of the plurality of the alternating first conductive layers, the second conductive layers, and the at least one dielectric layer; and
etching the second trench selective to the plurality of the alternating first conductive layers and second conductive layers, wherein the second conductive layers are etches faster than the first conductive layers to form a second modified trench, wherein the second conductive layers are recessed relative to the center of the second modified trench greater than the first conductive layers.

14. The method of claim 13, further comprising:
after etching the first trench, depositing a first isolating material in the first modified trench; and
after etching the second trench, depositing a second isolating material in the second modified trench.

15. The method of claim 14, further comprising:
depositing a first conductive contact through the first isolating material such that the recessed first conductive layers contact the first conductive contact and the recessed second conductive layers contact the first isolating material without contacting the first conductive contact.

16. The method of claim 15, further comprising:
depositing a second conductive contact through the second isolating material such that the recessed second conductive layers contact the second metal contact and the recessed first conductive layers contact the second isolating material without contacting the second conductive contact.

17. The method of claim 16, further comprising:
removing portions of the first conductive layers, the second conductive layers, and the at least one dielectric layer between each of the alternating first conductive layers and the second conductive layers external to the first contact and the second contact; and
forming an insulator region about the periphery of the first contact and the second contact.

18. The method of claim 12, wherein the first conductive layers are metal layers of a first metallic material, and the second conductive layers are metal layers of a second metallic material different from the first metallic material.

19. The method of claim 12, wherein the first conductive layers are polycrystalline doped semiconductor material layers of a first material, and the second conductive layers are doped polycrystalline semiconductor material layers of a second material different from the first material.

20. A semiconductor structure comprising:
a first semiconductor substrate in contact with a first insulator layer;
a second semiconductor substrate in contact with a second insulator layer;
a plurality of alternating first conductive layers and second conductive layers formed on the first insulator layer overlying the first substrate;
at least one dielectric layer between each of the alternating first conductive layers and the second conductive layers;
a first conductive contact formed in a first trench located in a first portion of the semiconductor structure in contact with the first conductive layers and isolated from the second conductive layers by a first isolation material in the first trench;
a second conductive contact formed in a second trench located in a second portion of the semiconductor structure in contact with the second conductive layers and isolated from the first conductive layers by a second isolation material in the second trench,
wherein the first conductive layers are recessed relative to the center of the first trench greater than the second conductive layers,
wherein the second conductive layers are recessed relative to the center of the second trench greater than the first conductive layers, and
wherein the plurality of alternating first conductive layers and the second conductive layers are formed underlying the second insulator layer and the second substrate.

* * * * *